(12) United States Patent
Andersson

(10) Patent No.: US 11,385,291 B2
(45) Date of Patent: Jul. 12, 2022

(54) BATTERY MONITORING UNIT AND METHOD THEREOF

(71) Applicant: CTEK Sweden AB, Vikmanshyttan (SE)

(72) Inventor: Helge Andersson, Gothenburg (SE)

(73) Assignee: CTEK Sweden AB, Vikmanshyttan (SE)

(*) Notice: Subject to any disclaimer, the term of this patent is extended or adjusted under 35 U.S.C. 154(b) by 341 days.

(21) Appl. No.: 16/349,724

(22) PCT Filed: Oct. 11, 2017

(86) PCT No.: PCT/EP2017/075972
§ 371 (c)(1),
(2) Date: May 14, 2019

(87) PCT Pub. No.: WO2018/086814
PCT Pub. Date: May 17, 2018

(65) Prior Publication Data
US 2019/0324088 A1  Oct. 24, 2019

(30) Foreign Application Priority Data
Nov. 14, 2016 (SE) .................... 1651483-8

(51) Int. Cl.
*G01R 31/367* (2019.01)
*G01R 31/3835* (2019.01)
*G01R 31/371* (2019.01)

(52) U.S. Cl.
CPC ......... *G01R 31/367* (2019.01); *G01R 31/371* (2019.01); *G01R 31/3835* (2019.01)

(58) Field of Classification Search
None
See application file for complete search history.

(56) References Cited

U.S. PATENT DOCUMENTS 5,698,983 A * 12/1997 Arai .................... G01R 31/3828
324/427
5,847,566 A    12/1998 Marritt et al.
(Continued)

FOREIGN PATENT DOCUMENTS

| CN | 1668933 | 9/2005 |
| CN | 104614679 | 5/2015 |
| EP | 1 548 453 A1 | 6/2005 |

OTHER PUBLICATIONS

Chinese Office Action issued by CNIPO for corresponding Chinese Application No. 201780070265.0 dated Jan. 7, 2021.
(Continued)

*Primary Examiner* — Roy Y Yi
(74) *Attorney, Agent, or Firm* — Renner, Otto, Boisselle & Sklar, LLP

(57) ABSTRACT

The disclosure relates to a method performed by a battery monitoring unit configured for estimating a battery discharging current of a battery comprising the steps obtaining a state-of-charge value indicative of a ratio between a current capacity and a maximum capacity of the battery, obtaining sensor data indicative of a first plurality of battery voltage values obtained at multiple subsequent points in time, determining a first voltage trend over time of the first plurality of battery voltage values, estimating a battery discharging current of the battery based on a relation, where the relation is dependent on the first voltage trend over time and the state-of-charge value.

8 Claims, 4 Drawing Sheets

(56) References Cited

U.S. PATENT DOCUMENTS

| | | |
|---|---|---|
| 2007/0145953 A1 | 6/2007 | Asai et al. |
| 2011/0234167 A1* | 9/2011 | Kao .................. G01R 31/3828 320/132 |
| 2015/0046110 A1 | 2/2015 | Joe et al. |
| 2016/0103185 A1 | 4/2016 | Chang et al. |

OTHER PUBLICATIONS

International Search Report and Written Opinion for corresponding Patent Application No. PCT/EP2017/075972 dated Dec. 22, 2017.

* cited by examiner

BATTERY MONITORING UNIT AND METHOD THEREOF

TECHNICAL FIELD

The present invention relates to battery monitoring unit configured for estimating a battery discharging current of a battery. The invention further relates to a corresponding method, computer program, computer program product and carrier.

BACKGROUND

A battery is often used in a craft, such as a vehicle, caravan or a boat for various purposes. The conventional use of a battery, e.g. as a starter battery in a car, includes to the largest extent a charging phase where the battery receives a charging current and an idle phase where the battery delivers no or a very low discharge current. However, today a craft battery is often used also in a way that the battery is delivering a discharge current during longer periods of time.

The capacity to deliver a discharge current from the battery may be given as a current capacity, e.g. in Ampere hours, and a maximum capacity corresponding to when the battery is fully charged. To keep track of the current capacity of the battery, the current capacity is typically periodically calculated or determined by estimating and/or measuring a charging/discharging current value for a time interval and add/reduce the previous current capacity value with the product of the current value and a time interval, e.g. a sampling interval.

A state-of-charge, SoC, value may be used to describe a ratio between a current capacity and a maximum capacity of the battery, typically as a fraction value or as a percentage value, e.g. 0.5 or 50%.

Several conventional devices exists for determining the SoC by means of precise current and voltage measurements, see for example the reference design by AMS in the integrated circuit AS8510, http://www.ams.com./eng/Products/Sensor-Interfaces/Data-Acquisition-Front-End/AS8510. This solution requires a shunt resistor for measuring the current from/to the battery.

A problem with conventional systems may be that additional components, such as the shunt resistor, are required to obtain the charging/discharging current value. A further problem with conventional systems may be reduced current and/or capacity estimation quality, in particular for use cases in a craft where the battery delivers a discharge current is during a longer period of time.

Thus, there is a need for an improved battery monitoring unit and method thereof for estimating a discharge current.

OBJECTS OF THE INVENTION

An objective of embodiments of the present invention is to provide a solution which mitigates or solves the drawbacks and problems of conventional solutions.

SUMMARY OF THE INVENTION

The above and further objectives are achieved by the subject matter of the independent claims. Further advantageous implementation forms of the invention are defined by the dependent claims.

An "or" in this description and the corresponding claims is to be understood as a mathematical OR which covers "and" and "or", and is not to be understand as an XOR (exclusive OR). The indefinite article "a" in this disclosure and claims is not limited to "one" and can also be understood as "one or more", i.e., plural.

The above objectives are solved by the subject matter of the independent claims. Further advantageous implementation forms of the present invention can be found in the dependent claims.

An object of the present invention is disclosed in the claims. The present description also provides a low-cost alternative to current battery monitoring units, which is easy to transport and install, and which provide an improved current and/or capacity estimation quality. It is a further object of the invention to provide increased freedom to a user of a craft by providing remote or local monitoring possibilities using the same battery monitoring unit. According to the present description, a battery monitoring unit is provided that identifies when the battery is used in a scenario where the battery delivers a discharge current during a longer period of time, e.g. compared to a relatively short period of starting an engine, and adapts the method in which a battery current is estimated and thus how the battery capacity and/or state-of-charge value is calculated.

According to the present description, a battery monitoring unit is provided that improves the estimation quality and allows for prediction of future current values by analysing previous voltage measurements as well as a current voltage measurement.

According to the present description, a voltage sensor is provided that is arranged at the craft and provides the user of the battery monitoring unit battery voltage values either locally at the craft or at a remote location.

Further applications and advantages of embodiments of the invention will be apparent from the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
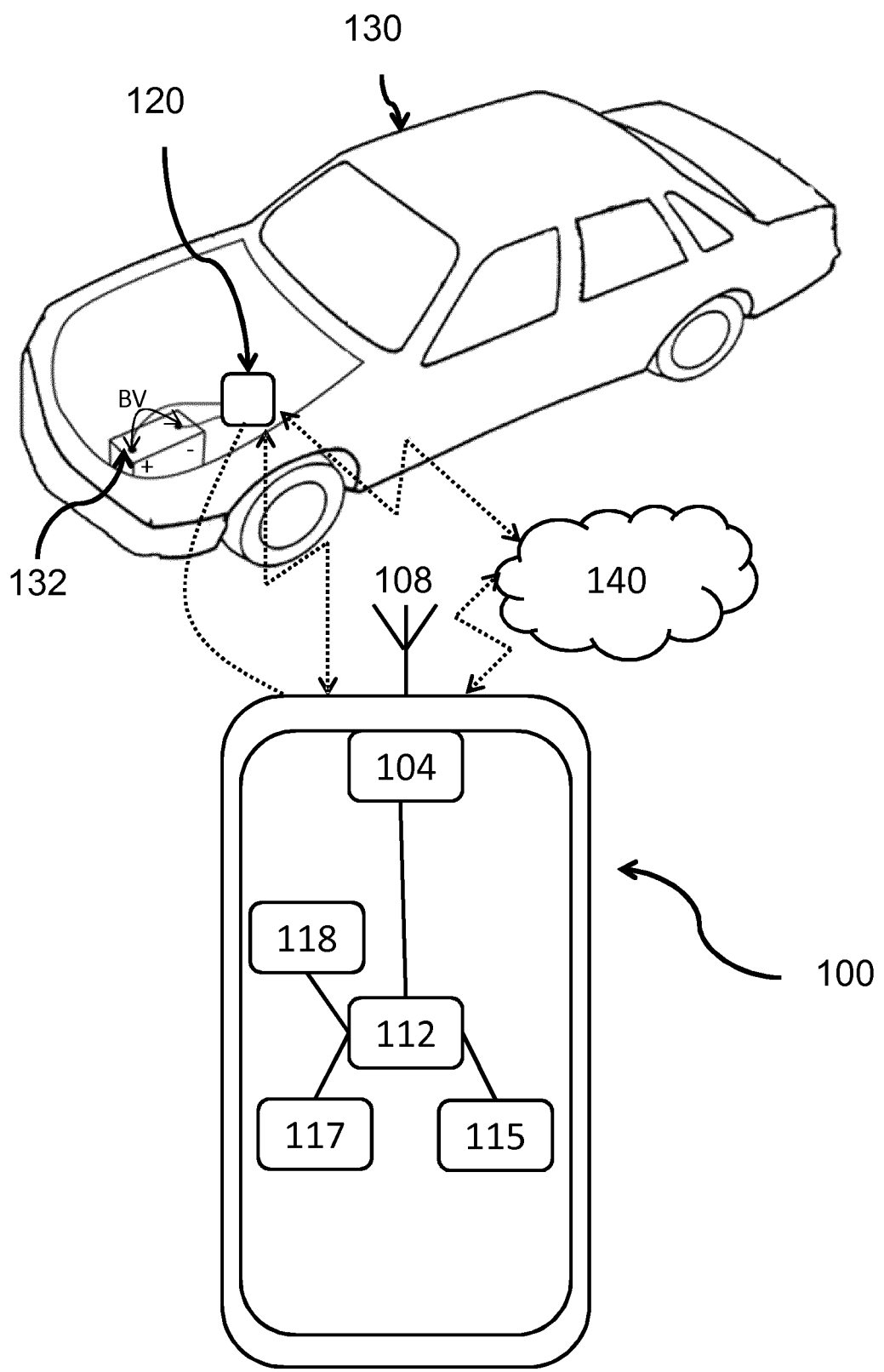
FIG. 1 shows a battery monitoring unit and an optional voltage sensor according to an embodiment of the present invention.

FIG. 1 schematically illustrates a battery monitoring unit 100 and an optional voltage sensor 120 according to an embodiment of the present invention. A craft 130 may be configured with a battery 132, e.g. serving as a power source of the craft. The battery monitoring unit 100 may be configured to monitor the battery 132 of the craft 130, e.g. the charging/discharging current and/or the capacity and/or a state-of-charge value. A craft 130 may be configured with a voltage sensor 120 comprised in and coupled to a battery 132 of the craft. Examples of crafts may be a vehicle, a caravan, an aircraft or a boat.

The voltage sensor 120 may be configured to measure a first plurality of voltage values of the battery 132 at multiple subsequent points in time, and/or send the first plurality of voltage values to the battery monitoring unit 100, e.g. via wired or wireless communication, such as Bluetooth, WiFi etc. In an example, the voltage sensor 120 comprises sensor means arranged for measuring a voltage and generate battery voltage data. The voltage sensor 120 may comprise a processor communicatively coupled to the sensor means and/or a transceiver for wired or wireless communication. Further, the voltage sensor 120 may further comprise at least one optional antenna. The antenna may be coupled to the transceiver and is configured to transmit and/or emit and/or receive a wireless signals in a wireless communication system, e.g. emit plurality of voltage values as a wired or wireless signal. In one example, the processor may be any of processing circuitry and/or a central processing unit and/or processor modules and/or multiple processors configured to cooperate with each-other. Further, the voltage sensor 120 may further comprise a memory. The memory may contain instructions executable by the processor to perform the methods described herein. The processor may be communicatively coupled to a selection of the transceiver 104 and the memory. The voltage sensor 120 may be configured to send the plurality of voltage values directly to the battery monitoring unit 100 or via a wired and/or wireless communications network 140. The a wireless communications network 140 may comprise any of a Bluetooth, GSM, UMTS, LTE or LTE advanced communications network or any other wired or wireless communication network known in the art.

The battery monitoring unit 100 may be in the form of a server, an on-board computer, an digital information display, a stationary computing device, a laptop computer, a tablet computer, a handheld computer, a wrist-worn computer, a smart watch, a PDA, a Smartphone, a smart TV, a telephone, a media player, a game console, a vehicle mounted computer system or a navigation device.

The battery monitoring unit 100 may comprise a processor 112 communicatively coupled to a transceiver 104 for wired or wireless communication. Further, the battery monitoring unit 100 may further comprise at least one optional antenna 108. The antenna may be coupled to the transceiver 104 and is configured to transmit and/or emit and/or receive a wireless signals in a wireless communication system, e.g. emit plurality of voltage values as a wired or wireless signal. In one example, the processor 112 may be any of processing circuitry and/or a central processing unit and/or processor modules and/or multiple processors configured to cooperate with each-other. Further, the battery monitoring unit 100 may further comprise a memory 115. The memory 115 may contain instructions executable by the processor to perform the methods described herein. The processor 112 may be communicatively coupled to a selection of the transceiver 104 and the memory 115. The battery monitoring unit 100 may be configured to receive the plurality of voltage values directly from the voltage sensor 120 or via the wired and/or wireless communications network 140. In an embodiment, the from the voltage sensor 120 may be comprised in the battery monitoring unit 100.

The battery monitoring unit 100 may further comprise a communications interface, e.g. comprised in the wired/wireless transceiver 104 and/or a wired/wireless communications network adapter. The transceiver 104 may be configured to send and/or receive data values or parameters as a signal to or from the processing means 112 to or from other external nodes, e.g. between the voltage sensor 120 and the battery monitoring unit 100. In an embodiment, the communications interface communicates directly between units and/or sensors and/or network nodes or via the communications network 140. In one or more embodiments the battery monitoring unit 100 may further comprise an input device 117, configured to receive input or indications from a user and send a user-input signal indicative of the user input or indications to the processing means 112. In one or more embodiments the battery monitoring unit further comprises a display 118 configured to receive a display signal indicative of rendered objects, such as text or graphical user input objects, from the processing means 112 and to display the received signal as objects, such as text or graphical user input objects. In one embodiment the display 118 is integrated with the user input device 117 and is configured to receive a display signal indicative of rendered objects, such as text or graphical user input objects, from the processing means 112 and to display the received signal as objects, such as text or graphical user input objects, and/or configured to receive input or indications from a user and send a user-input signal indicative of the user input or indications to the processing means 112. In embodiments, the processing means 112 is communicatively coupled to the memory 115 and/or the communications interface and/or the input device 117 and/or the display 118 and/or one or more sensors, such as the voltage sensor 120. In embodiments, the communications interface and/or transceiver communicates using any of wired and/or wireless communication techniques known in the art. In embodiments, the one or more memory 115 may comprise any of a selection of a hard RAM, disk drive, a floppy disk drive, a magnetic tape drive, an optical disk drive, a CD or DVD drive (R or RW), or other removable or fixed media drive. In a further embodiment, the battery monitoring unit 100 may further comprise one or more additional sensors configured to receive and/or obtain and/or measure physical properties pertaining to the respective craft 130 and send one or more sensor signals indicative of the physical properties to the processing means 112.

Figure 2:
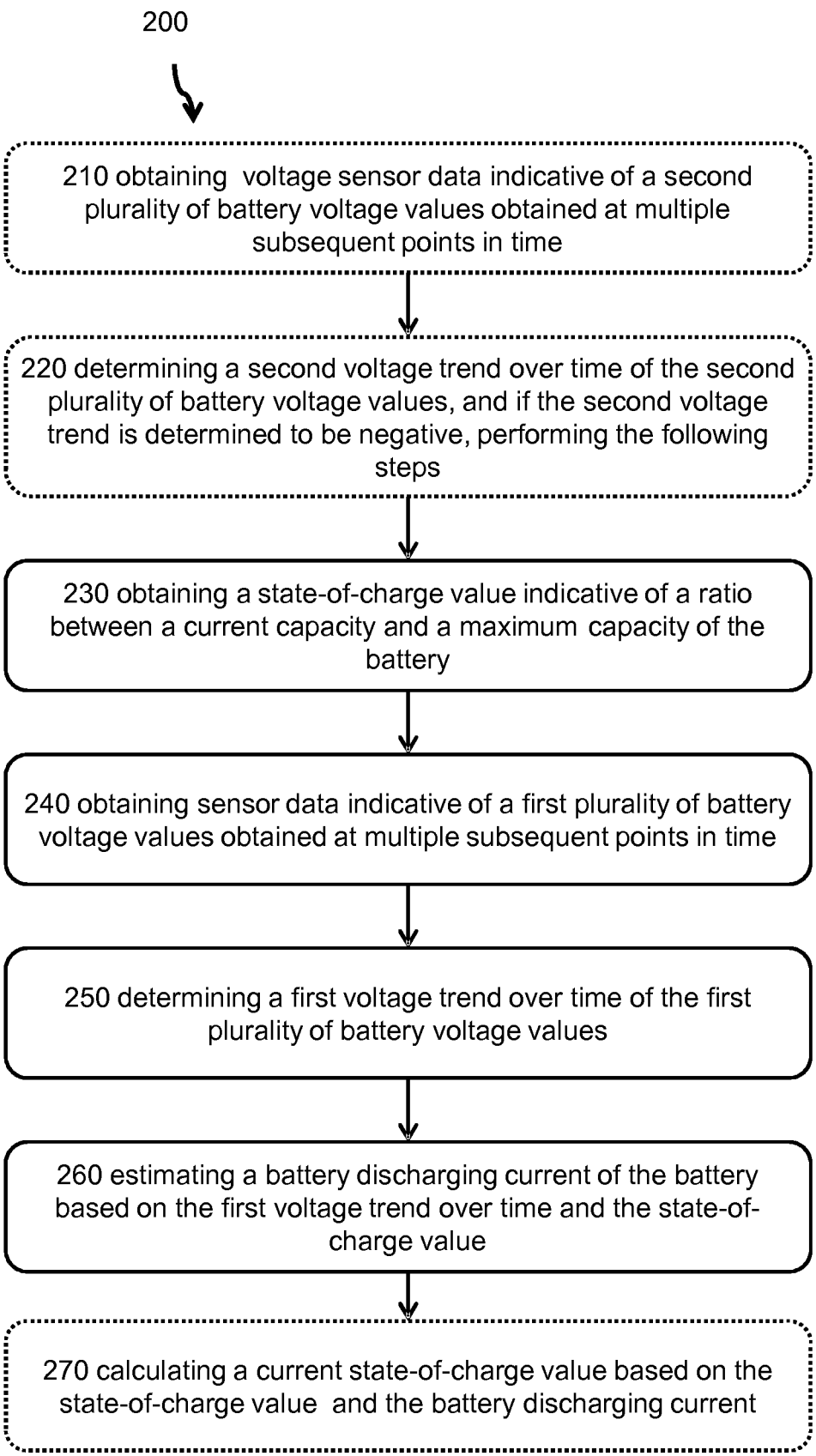
FIG. 2 shows a block diagram of a method according to one or more embodiments of the present invention.

FIG. 2 shows a block diagram of a method 200 performed by a battery monitoring unit 100 configured for estimating a battery discharging current of a battery 132. The method comprises:

STEP 230: obtaining a state-of-charge value indicative of a ratio between a current capacity and a maximum capacity of the battery 132. Obtaining the state-of-charge value may e.g. comprise calculating the state-of-charge value by the processor 112, receiving the state-of-charge value from another unit and/or server via the wired and/or wireless communications network 140, or retrieving the state-of-charge value from the memory 115 and/or other digital storage medium. In one example the state-of-charge value is calculated based on an estimated battery charging current using columb counting, e.g. as further described below in relation to step 225. In yet an example, the state-of-charge value is retrieved as the previously measured and/or calculated and/or determined and/or estimated state-of-charge value.

STEP 240: obtaining (240) sensor data indicative of a first plurality of battery voltage values obtained at multiple subsequent points in time. In one example, first plurality of battery voltage values is received comprised in a wired signal from the voltage sensor 120. In one additional example, the first plurality of battery voltage values is received comprised in a wireless signal, e.g. a Bluetooth or WiFi signal, e.g. from the voltage sensor 120.

STEP 250: determining a first voltage trend over time of the first plurality of battery voltage values. Determining a first voltage trend may be performed by curve fitting a function to the first plurality of battery voltage values. The function that is curve fitted may be a line defined by a slope value and an intercept value. Determining a first voltage trend may be performed by determining the first voltage trend as the slope value of the function and/or line. Determining a first voltage trend may be performed by determining the first voltage trend as an average of a current slope value and a plurality of historical slope values, e.g. calculate a rolling average, a geometrical average or any other suitable average or filtering. In one example, the first voltage trend is determined by curve fitting a line to two or more battery voltage values and determining the first voltage trend as the slope of the line. In one further example, a plurality of historical slope values have been determined at previous points in time, $T_{-3}$, $T_{-2}$, $T_{-1}$ and a current slope value has been determined as the slope of a curve fitted line at a current/present point in time $T_0$. The first voltage trend may then be determined as:

first voltage trend=$c3*\text{slope}(T_{-3})+c2*\text{slope}(T_{-2})+c1*\text{slope}(T_{-1})+c0*\text{slope}(T_0)$, where c0, c1, c2 and c3 are rolling average constants, e.g equal to 0.25.

STEP 260: estimating a battery discharging current of the battery 132 based on a relation, where the relation is dependent on the first voltage trend over time and the state-of-charge value. The relation may further be dependent of the maximum capacity of the battery. The relation may in one example be a statistical model obtained by performing measurements of battery voltage values of various batteries and the corresponding state-of-charge, SoC, values. The relation may be in the form of a function or a look-up-table LUT.

In an embodiment, the method further, prior to performing any of steps 230-260, comprises:

STEP 210 obtaining voltage sensor data indicative of a second plurality of battery voltage values obtained at multiple subsequent points in time. In one example, a current battery voltage value $U_0$ is obtained at $T_0$ together with a previous battery voltage value $U_{-1}$ at a previous point in time $T_{-1}$.

STEP 220: determining 220 a second voltage trend over time of the second plurality of battery voltage values, and if the second voltage trend is determined to be negative and/or decreasing, performing steps 230-260. Determining the second voltage trend to be negative and/or decreasing may be performed by determining that:

the difference between a previous battery voltage value $U_{-1}$ obtained at a previous point in time $T_{-1}$ and a current battery voltage value $U_0$ obtained at a current point in time $T_0$ is greater than a triggering threshold. The second voltage trend may be determined in a similar manner as described above in relation to step 250.

Optional STEP 225 (not shown in image): further comprising estimating a battery charging current if the second voltage trend is not determined to be negative and/or decreasing. A state-of-charge value may be calculated based on the estimated battery charging current.

In one example, the battery voltage is measured as a battery voltage value. It may then be determined that the battery is charging. Determining that the battery is charging may be performed by detecting or determining that the battery voltage value or open circuit voltage OCV is equal to or above the charging voltage threshold, e.g 13.2 V. The charging current may then be estimated using a function dependent on a previous calculation of a coulomb counting state-of-charge SoC(CC) or total state-of-charge, e.g. based on a previous measurement of the battery voltage value. The function may be based on an experience based relation, e.g. in the form of a look-up table LUT, based on measurements on state-of-charge and battery charging current of a charging battery. The total state-of-charge may then be calculated as a coulomb counting state-of-charge SoC(CC) by adding the previous calculation of the coulomb counting state-of-charge SoC(CC) or total state-of-charge and the product of the battery charging current multiplied with a predetermined time period, e.g. the sampling interval of the battery voltage value. Furthermore, upon detection that the battery is below the charging voltage threshold is then determined that the battery is not charging and that the battery charging current may then be calculated as zero Ampere (0 A).

In an embodiment, the method further comprises the optional step:

STEP 270 calculating a current state-of-charge value based on the state-of-charge value and the battery discharging current.

In a second aspect of the invention, a battery monitoring unit 100 is provided and configured for estimating a battery discharging current of the battery 132, the battery monitoring unit comprising:

a communications interface 116 configured to send or receive data, a processor 112, and a memory 115, said memory containing instructions executable by said processor, whereby said battery monitoring unit 100 is operative and/or configured to perform any of the methods described herein.

In a third aspect of the invention, a computer program is provided and comprises computer-executable instructions for causing the battery monitoring unit 100 when the computer-executable instructions are executed on a processing circuit comprised in the battery monitoring unit, to perform any of the methods described herein.

In a fourth aspect of the invention, a computer program product is provided and is comprising a computer-readable storage medium, the computer-readable storage medium having the computer program embodied therein.

In a fifth aspect of the invention, a carrier containing the computer program above, where the carrier is one of an electronic signal, optical signal, radio signal, or computer readable storage medium.

In a sixth aspect of the invention, a voltage sensor 120 is provided and configured to measure, e.g. by the sensor means, a first plurality of voltage values of a battery 132 at multiple subsequent points in time, and send, e.g. by the processor, the first plurality of voltage values to the battery monitoring unit 100, e.g via the transceiver.

Figure 3:
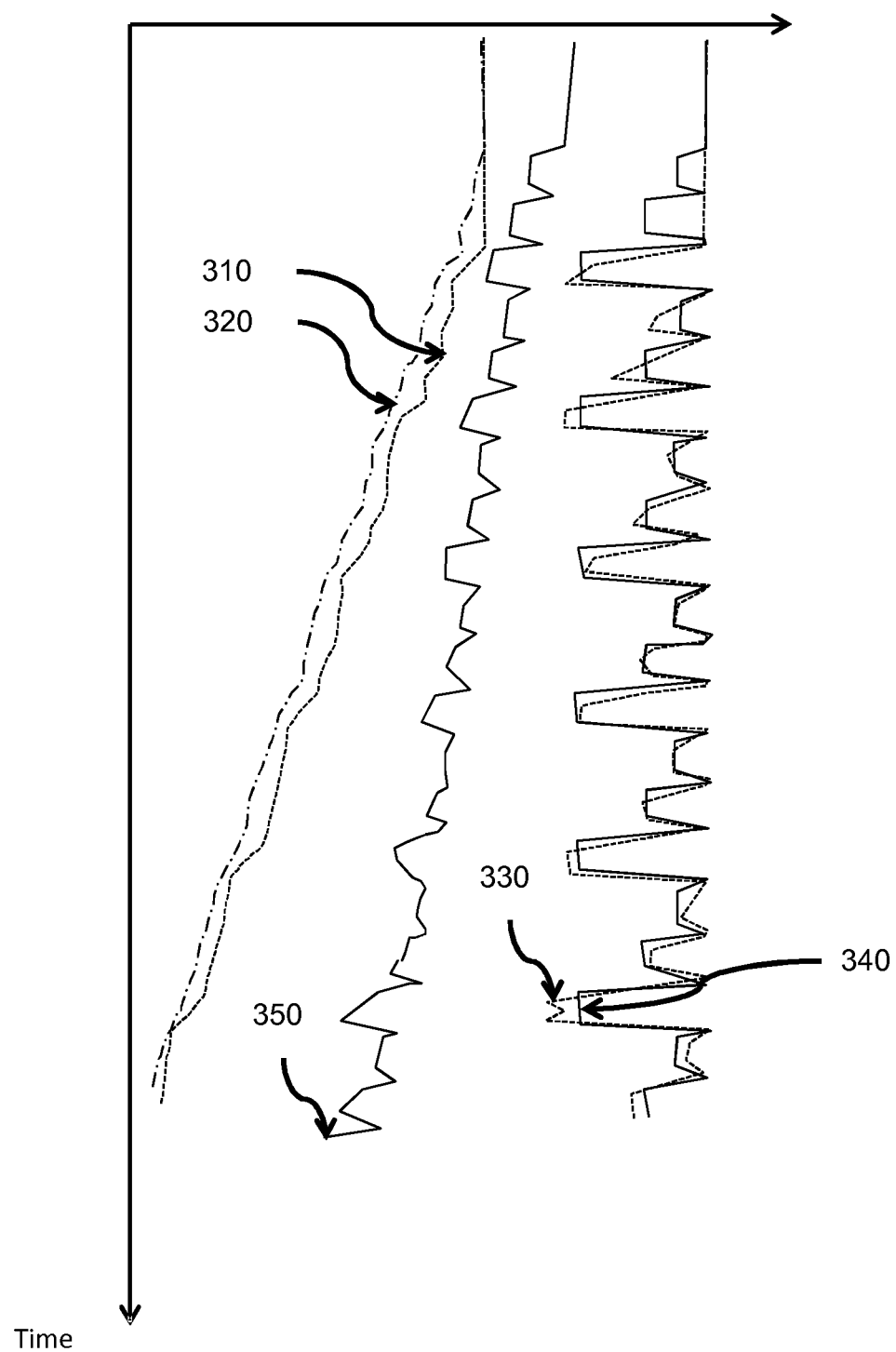
FIG. 3 illustrates a comparison between a measured battery discharging current and a battery discharging current estimated according to an embodiment of the present invention.

FIG. 3 illustrates a comparison between a measured battery discharging current and a battery discharging current estimated according to an embodiment of the present invention. It can be seen from FIG. 3 that the estimated battery discharging current 340, according to the present disclosure, closely follow the reference battery discharging current 330. Thus, the capacity estimation quality is improved, in particular for use cases in a craft where the discharge current is substantial and/or not neglectable. FIG. 3 further shows a diagram including the corresponding current battery voltage values 350. FIG. 3 also shows diagrams indicating a calculated current battery capacity and/or state of charge value 310, according to the present disclosure, together with corresponding reference battery capacity and/or reference state of charge value 320.

Figure 4:
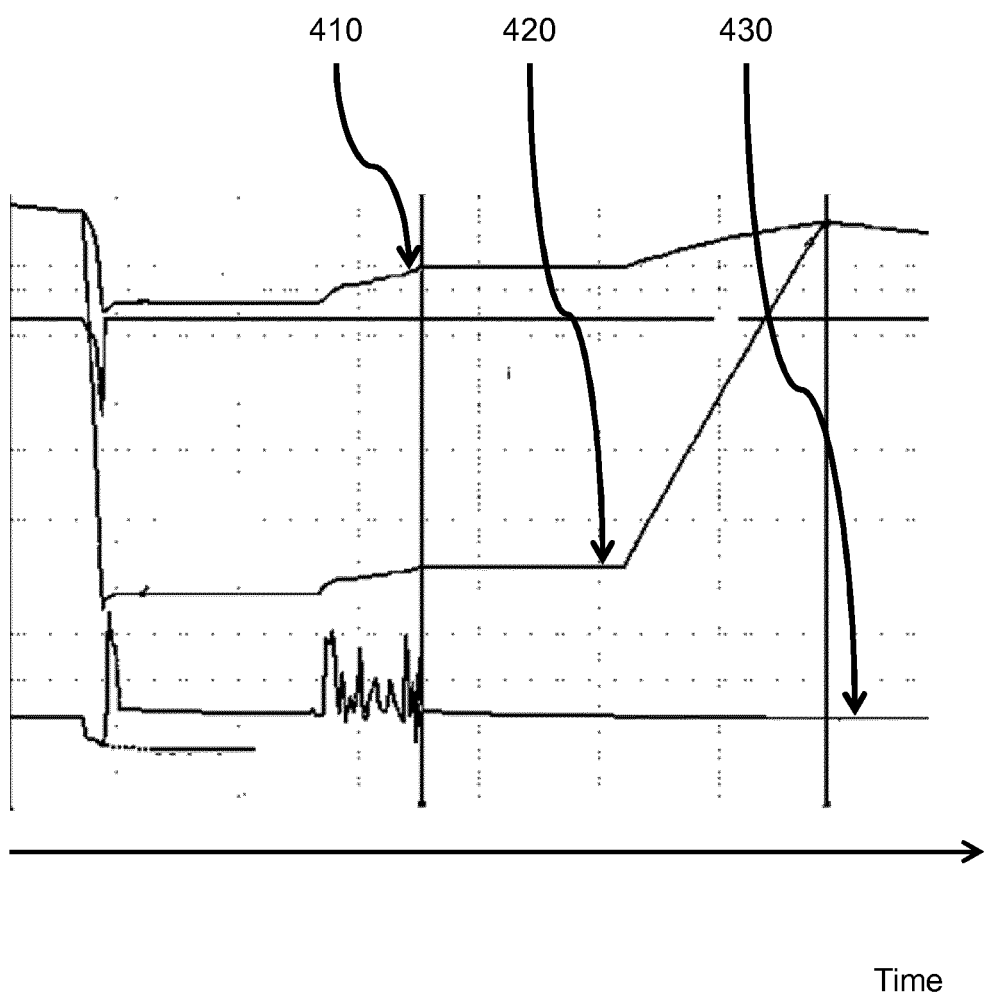
FIG. 4 illustrates a comparison between a SoC value calculated according to a conventional method and a SoC value calculated according to an embodiment of the present invention.

FIG. 4 illustrates a comparison between a SoC value calculated according to a conventional method, e.g. based only on estimated and/or measured charging current, and a SoC value calculated according to an embodiment of the present invention, i.e. based on an estimated discharging current. FIG. 4 shows diagrams indicating a calculated current battery capacity and/or state of charge value 410, according to the present disclosure, together with corresponding reference battery capacity and/or reference state of charge value 420, calculated according to conventional methods. FIG. 4 further shows a diagram including the corresponding current battery voltage values 430.

Furthermore, any methods according to embodiments of the invention may be implemented in a computer program, having code means, which when run by processing means causes the processing means to execute the steps of the method. The computer program is included in a computer readable medium of a computer program product.

In an embodiment, a computer program product comprising a memory and/or a computer-readable storage medium, the computer-readable storage medium having the computer program described above embodied therein. The memory and/or computer-readable storage medium referred to herein may comprise of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

In embodiments, the communications network 140 communicate using wired or wireless communication techniques that may include at least one of a Local Area Network (LAN), Metropolitan Area Network (MAN), Global System for Mobile Network (GSM), Enhanced Data GSM Environment (EDGE), Universal Mobile Telecommunications System, Long term evolution, High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX) and ultrasonic communication, etc., but is not limited thereto.

Moreover, it is realized by the skilled person that the battery monitoring unit 100 may comprise the necessary communication capabilities in the form of e.g., functions, means, units, elements, etc., for performing the present solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the present solution.

Especially, the processor of the present battery monitoring unit 100 may comprise a processor and/or processing circuitry and/or processing means, e.g., one or more instances of processing circuitry, processor modules and multiple processors configured to cooperate with each-other, Central Processing Unit (CPU), a processing unit, a processing circuit, a processor, an Application Specific Integrated Circuit (ASIC), a microprocessor, a Field-Programmable Gate Array (FPGA) or other processing logic that may interpret and execute instructions. The expression "processor" may thus represent a processing circuitry comprising a plurality of processing circuits, such as, e.g., any, some or all of the ones mentioned above. The processing means may further perform data processing functions for inputting, outputting, and processing of data comprising data buffering and device control functions, such as call processing control, user interface control, or the like.

Finally, it should be understood that the invention is not limited to the embodiments described above, but also relates to and incorporates all embodiments within the scope of the appended independent claims.

The invention claimed is:

1. A method performed by a battery monitoring unit configured for estimating a battery discharging current of a battery:
    obtaining a state-of-charge value indicative of a ratio between a current capacity and a maximum capacity of the battery,
    obtaining sensor data indicative of a first plurality of battery voltage values obtained at multiple subsequent points in time,
    determining a first voltage trend over time of the first plurality of battery voltage values,
    estimating a battery discharging current of the battery based on a relation, where the relation is dependent on the first voltage trend over time and the state-of-charge value.

2. The method according to claim 1, further comprising:
    obtaining voltage sensor data indicative of a second plurality of battery voltage values obtained at multiple subsequent points in time,
    determining a second voltage trend over time of the second plurality of battery voltage values, and if the second voltage trend is determined to be negative, performing the steps of claim 1.

3. The method of claim 1, further comprising:
    calculating a current state-of-charge value based on the state-of-charge value and the battery discharging current.

4. The method of claim 1, wherein determining a first voltage trend and/or determining a second voltage trend is performed by curve fitting a function to the first and/or second plurality of battery voltage values.

5. The method of claim 4, wherein the function is a line defined by a slope and an intercept value.

6. A battery monitoring unit configured for estimating a battery discharging current of a battery comprising:
    a tranceiver configured to send or receive data,
    a processor, and
    a memory, said memory containing instructions executable by said processor, whereby said battery monitoring unit is operative and/ or configured to perform the method of claim 1.

7. A computer program stored on a non-transitory computer-readable storage medium and comprising computer-executable instructions for causing a battery monitoring unit when the computer-executable instructions are executed on a processing circuit comprised in the battery monitoring unit, to perform the method of claim 1.

8. A computer program product comprising the non-transitory computer-readable storage medium having the computer program according to claim 7 stored thereon.

* * * * *